United States Patent
Choi (10) Patent No.: US 9,129,664 B2
(45) Date of Patent: Sep. 8, 2015

(54) INTERNAL VOLTAGE GENERATING CIRCUIT CAPABLE OF CONTROLLING SWING WIDTH OF DETECTION SIGNAL IN SEMICONDUCTOR MEMORY APPARATUS

(71) Applicant: SK HYNIX INC., Gyeonggi-do (KR)

(72) Inventor: Min-Seok Choi, Gyeonggi-do (KR)

(73) Assignee: SK HYNIX INC., Gyeonggi-do (KR)

( * ) Notice: Subject to any disclaimer, the term of this patent is extended or adjusted under 35 U.S.C. 154(b) by 0 days.

(21) Appl. No.: 14/471,358

(22) Filed: Aug. 28, 2014

(65) Prior Publication Data

US 2014/0369140 A1    Dec. 18, 2014

Related U.S. Application Data

(62) Division of application No. 12/494,623, filed on Jun. 30, 2009, now Pat. No. 8,829,978.

(30) Foreign Application Priority Data

May 14, 2009 (KR) ........................ 10-2009-0042169

(51) Int. Cl.
  *G11C 5/14* (2006.01)
  *G11C 7/12* (2006.01)
  *G11C 7/22* (2006.01)

(52) U.S. Cl.
  CPC ................ *G11C 5/147* (2013.01); *G11C 5/143* (2013.01); *G11C 7/12* (2013.01); *G11C 7/22* (2013.01)

(58) Field of Classification Search
  CPC .............................. H03M 1/361; H03M 1/365
  See application file for complete search history.

(56) References Cited

U.S. PATENT DOCUMENTS

| 6,150,860 | A   | 11/2000 | Chun |
| 6,522,193 | B2  | 2/2003  | Shin |
| 6,836,176 | B2  | 12/2004 | Zeng et al. |
| 6,958,947 | B2  | 10/2005 | Park et al. |
| 7,046,074 | B2  | 5/2006  | Jang |
| 7,391,658 | B2  | 6/2008  | Do |
| 7,560,976 | B2  | 7/2009  | Choi et al. |
| 7,649,397 | B2  | 1/2010  | Son |
| 8,368,789 | B2  | 2/2013  | Xu et al. |
| 2005/0231269 | A1 | 10/2005 | Kim et al. |
| 2006/0091938 | A1 | 5/2006  | Kim |
| 2006/0140020 | A1 | 6/2006  | Do |
| 2007/0008201 | A1* | 1/2007 | Lee et al. ...................... 341/120 |
| 2007/0262887 | A1* | 11/2007 | Matsuura et al. ............... 341/50 |

FOREIGN PATENT DOCUMENTS

JP    2003-197764 A    11/2003
KR    1020070028073    3/2007

* cited by examiner

*Primary Examiner* — Sibin Chen
(74) *Attorney, Agent, or Firm* — Venable LLP; Jeffri A. Kaminski (57) ABSTRACT

An internal voltage generating circuit capable of controlling a swing width of a detection signal in a semiconductor memory apparatus is provided. The internal voltage generating circuit of a semiconductor memory apparatus includes an internal voltage level detecting unit configured to compare an internal voltage with a target voltage and then generate a detection signal, and an internal voltage level control unit configured to control the internal voltage based on a voltage level of the detection signal, wherein the internal voltage level detecting unit is configured to control a swing width of the detection signal based on a voltage difference between the internal voltage and the target voltage.

4 Claims, 5 Drawing Sheets

INTERNAL VOLTAGE GENERATING CIRCUIT CAPABLE OF CONTROLLING SWING WIDTH OF DETECTION SIGNAL IN SEMICONDUCTOR MEMORY APPARATUS

CROSS-REFERENCES TO RELATED APPLICATION

This application is a divisional of U.S. patent application Ser. No. 12/494,623, filed Jun. 30, 2009, which claims benefit under 35 U.S.C. 119(a) to Korean application number 10-2009-0042169, filed on May 14, 2009, in the Korean Intellectual Property Office, which is incorporated by reference in its entirety as if set forth in full.

BACKGROUND OF THE INVENTION

1. Technical Field

The embodiments of the disclosure relate to a semiconductor memory apparatus and, more particularly, to an internal voltage generating circuit for use in the semiconductor memory apparatus.

2. Related Art

Generally, a semiconductor memory apparatus generates a voltage required to drive internal circuits of the semiconductor memory apparatus using an external voltage supplied from outside of the semiconductor memory apparatus.

The voltage that is generated in the semiconductor memory apparatus is called an internal voltage and a circuit to generate the internal voltage in the semiconductor memory apparatus is called an internal voltage generating circuit.

The conventional internal voltage generating circuit compares the internal voltage with a reference voltage and carries out a voltage adjustment to increase or decrease the internal voltage based on the comparison result.

Accordingly, the internal voltage generating circuit includes a comparison circuit to compare an internal voltage level with the reference voltage level.

The comparison circuit compares the reference voltage level with the internal voltage level and then outputs an output signal. The output signal is generated as a digital signal that swings between the external voltage level and a ground voltage level.

Furthermore, assuming that the internal voltage generating circuit is a circuit to increase the internal voltage level when the output signal of the comparison circuit is transited to the ground voltage level, it is designed in such a manner that the internal voltage has to be increased as fast as possible to make the internal voltage reach to the target voltage level when the output signal of the comparison circuit is the ground voltage level.

While this internal voltage generating circuit may have an advantage in that internal voltage level is fast increased to the target voltage level, it has a disadvantage in that the internal voltage can be higher than the target voltage because an amount of the increment of the internal voltage is larger.

SUMMARY

An internal voltage generating circuit of a semiconductor memory apparatus capable of preventing an internal voltage from being higher than a target level is described herein.

According to an embodiment, an internal voltage generating circuit of a semiconductor memory apparatus comprises an internal voltage level detecting unit configured to compare an internal voltage with a target voltage and then generate a detection signal, and an internal voltage level control unit configured to control the internal voltage based on a voltage level of the detection signal, wherein the internal voltage level detecting unit is configured to control a swing width of the detection signal based on a voltage difference between the internal voltage and the target voltage.

According to another embodiment, an internal voltage generating circuit of a semiconductor memory apparatus, in which the internal voltage generating circuit generates a detection signal which is enabled when an internal voltage is lower than a target voltage and increase an increment range of the internal voltage as a voltage level of the enabled detection signal is getting lowered, the internal voltage generating circuit comprises a detection signal level controller to lower the detection signal when a voltage difference between the internal voltage and the target voltage is over a predetermined voltage level difference, wherein the lowered detection signal is lower than that generated when the voltage difference between the internal voltage and the target voltage is below the predetermined voltage level difference.

According to another embodiment, an internal voltage generating circuit of a semiconductor memory apparatus comprises a comparison unit configured to generate a preliminary detection signal by comparing an internal voltage with a reference voltage, an A/D converting unit configured to generate a code based on a voltage level of the internal voltage, a code voltage generating unit configured to output a code voltage corresponding to the code, a code detection unit configured to generate a control signal which is enabled when a value of the code is lower than a predetermined code value, a control-voltage-level controlling unit configured to generate a control voltage which is at a ground voltage level when the control signal is enabled and generate the control voltage which is corresponding to the code voltage when the control signal is disabled, a driving unit configured to output a detection signal by receiving an external voltage and the control voltage as driving voltages and then driving the preliminary detection signal, and an internal voltage level control unit configured to increase the internal voltage as the voltage level of the detection signal becomes lower.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
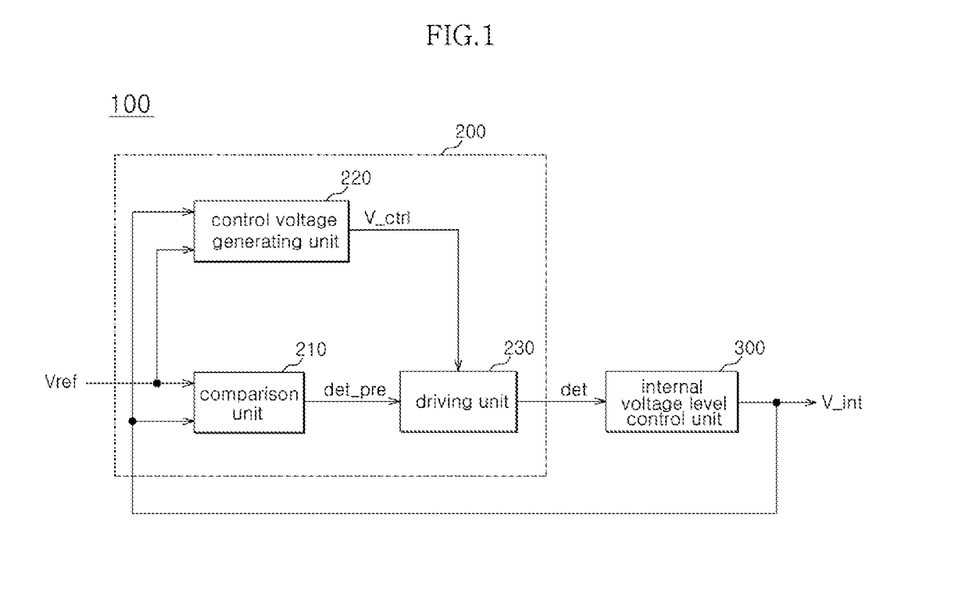
FIG. 1 is a schematic block diagram illustrating a structure of an example of an internal voltage generating circuit in a semiconductor memory apparatus according to one embodiment.

As shown in FIG. 1, an internal voltage generating circuit 100 of a semiconductor memory apparatus according to one embodiment can include an internal voltage level detecting unit 200 and an internal voltage level control unit 300.

The exemplary internal voltage level detecting unit 200 may compare an internal voltage 'V_int' with a target level of the internal voltage 'V_int' and then outputs a detection signal 'det'. At this time, the internal voltage level detecting unit 200 is configured to control a swing width of the detection signal 'det' according to a voltage difference between the internal voltage 'V_int' and the target voltage.

The exemplary internal voltage level control unit 300 may control the internal voltage 'V_int' according to the voltage level of the detection signal 'det'.

In more detail, when the internal voltage 'V_int' is lower than the target voltage, the internal voltage level detecting unit 200 is configured to enable the detection signal 'det' and control a voltage level of the detection signal 'det' based on the voltage difference between the internal voltage 'V_int' and the target voltage.

The internal voltage level detecting unit 200 can include a comparison unit 210, a control voltage generating unit 220, and a driving unit 230.

The comparison unit 210 generates a preliminary detection signal 'det_pre' by comparing the internal voltage 'V_int' with a reference voltage 'Vref'.

The control voltage generating unit 220 determines a voltage level of a control voltage 'V_ctrl' by comparing the internal voltage 'V_int' with the reference voltage 'Vref'. For example, when the voltage difference between the internal voltage 'V_int' and the reference voltage 'Vref' is over a predetermined voltage level, the control voltage generating unit 200 generates the control voltage 'V_ctrl' which is lower than that generated when the voltage difference between the internal voltage 'V_int' and the reference voltage 'Vref' is below a predetermined voltage level.

The driving unit 230 drives the detection signal 'det_pre' up to the voltage level of the control voltage 'V_ctrl' and then outputs the driven voltage as the detection signal 'det'.

The control voltage generating unit 220 and the driving unit 230 control the voltage level of the detection signal 'det'. Accordingly, a combination of the control voltage generating unit 220 and the driving unit 230 can be united to a detection signal level controller.

Figure 2:
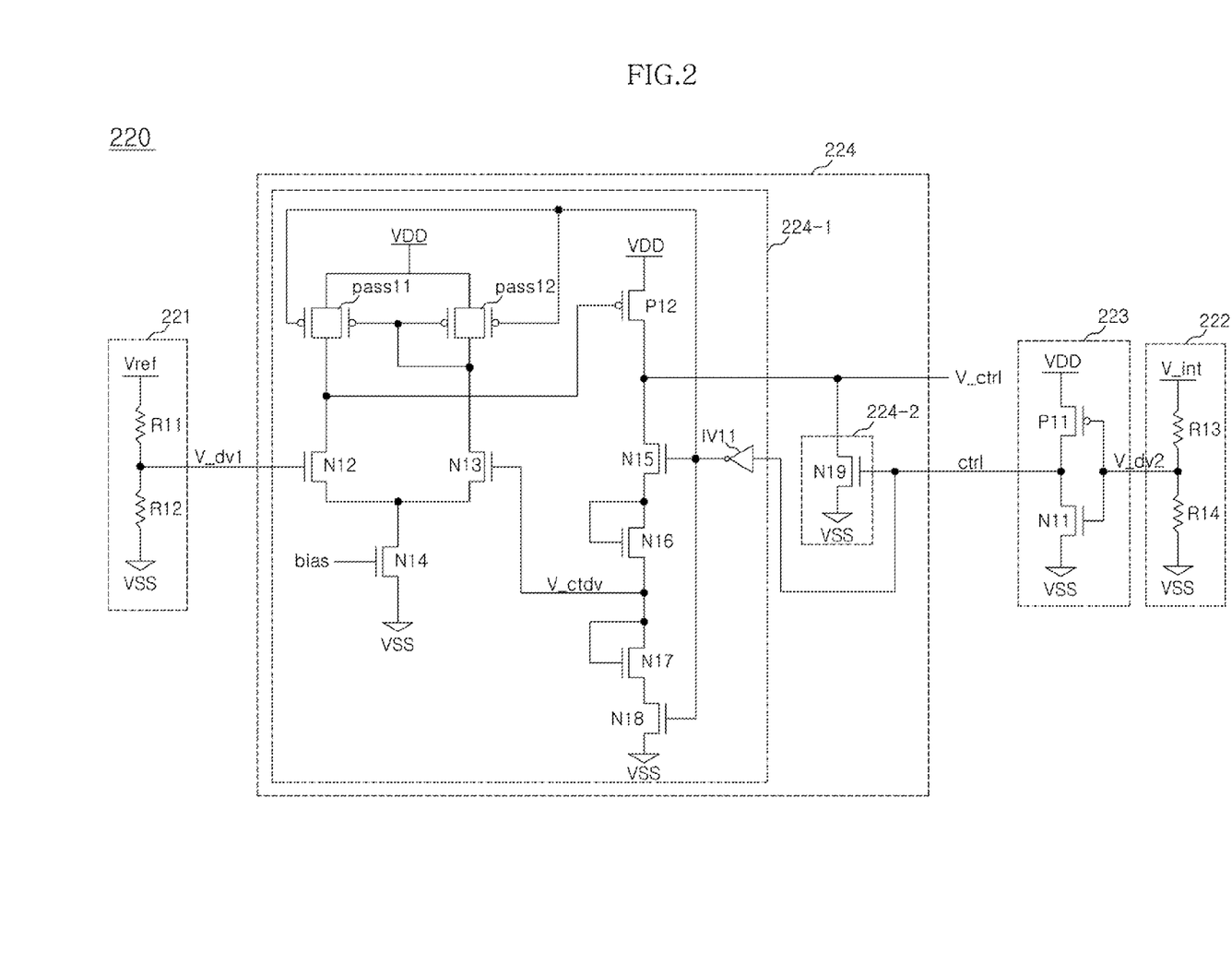
FIG. 2 is a circuit diagram illustrating a structure of an example of a control voltage generating unit of FIG. 1.

As shown in FIG. 2, the control voltage generating unit 220 can include a first voltage dividing unit 221, a second voltage dividing unit 222, a voltage detecting unit 223, and a control-voltage-level controlling unit 224.

The first voltage dividing unit 221 generates a divided reference voltage 'V_dv1' by dividing the reference voltage 'Vref'.

The first voltage dividing unit 221 can include first and second resistors R11 and R12 which are coupled in series to each other. The reference voltage 'Vref' and the ground voltage 'VSS' are applied respectively to the terminals of the first voltage dividing unit 221. At this time, the divided reference voltage 'V_dv1' is output from a connection node between the first resistor R11 and the second resistor R12.

The second voltage dividing unit 222 generates a divided internal voltage 'V_dv2' by dividing the internal voltage 'V_int'.

The second voltage dividing unit 222 can include third and fourth resistors R13 and R14 which are coupled in series to each other. The internal voltage 'V_int' and the ground voltage 'VSS' are applied to the terminals of the second voltage dividing unit 222. At this time, the divided reference voltage 'V_dv2' is output from a connection node between the third resistor R13 and the fourth resistor R14.

The voltage detecting unit 223 detects the divided internal voltage 'V_dv2' and then generates a control signal 'ctrl'. For example, the voltage detecting unit 223 enables the control signal 'ctrl' when the divided internal voltage 'V_dv2' is below a predetermined voltage level.

The voltage detecting unit 223 includes a first transistor P11 and a second transistor N11. The first transistor P11 has a gate to which the divided internal voltage V_dv2' is applied and a source to which the external voltage 'VDD' is applied. The second transistor N11 has a drain which is coupled to a drain of the first transistor P11, a gate to which the divided internal voltage V_dv2' is applied, and a source to which the ground voltage 'VSS' is applied. At his time, the control signal 'ctrl' is output from a connection node between the first and second transistors P11 and N11.

The control-voltage-level controlling unit 224 is configured to compare the divided reference voltage 'V_dv1' with the control voltage 'V_ctrl' according to the control signal 'ctrl' and then control the level of the control voltage 'V_ctrl'. For example, the control-voltage-level controlling unit 224 generates the control voltage 'V_ctrl' at a ground voltage level when the control signal 'ctrl' is enabled, and generates the control voltage 'V_ctrl' at a voltage level corresponding to the divided reference voltage 'V_dv1' when the control signal 'ctrl' is disabled.

The control-voltage-level controlling unit 224 can include a voltage maintaining unit 224-1 and a discharging unit 224-2.

When the control signal 'ctrl' is disabled, the voltage maintaining unit 224-1 generates the control voltage 'V_ctrl' which is higher than the ground voltage 'VSS' by comparing the divided reference voltage 'V_dv1' with the control voltage 'V_ctrl'.

The voltage maintaining unit 224-1 can include third to tenth transistors N12 to N18 and P12, a first inverter IV11, and first and second passing units 'pass11 and pass12'. The first inverter IV11 receives the control signal 'ctrl'. The third transistor N12 has a gate to which the divided reference voltage 'V_dv1' is applied. The fourth transistor N13 has a gate to which a control division voltage 'V_ctdv' is applied. The fifth transistor N14 has a gate to which a bias voltage 'bias' is applied, a drain which is coupled to a common node to be connected to sources of the third and fourth transistors N12 and N13, and a source to which the ground voltage 'VSS' is applied. The first passing unit 'pass11' has a first control terminal to receive an output signal of the first inverter IV11, an input terminal to receive the external voltage 'VDD', and an output terminal to be connected to a drain of the third transistor N12. The second passing unit 'pass12' has a first control terminal to be connected to a second control terminal of the first passing unit 'pass11', a second control terminal to receive the output signal of the first inverter IV11, an input terminal to which the external voltage 'VDD' is applied, and an output terminal to be provided at a node at which the first passing unit 'pass11', the second passing unit 'pass12' and the drain of the fourth transistor N13 are connected to each other. At this time, each of the first and second passing units 'pass11 and pass12' is turned on and then the input terminal is connected to the output terminal when a low level signal is applied to any one of the first and second control terminals.

The sixth transistor N15 has a gate to which the output signal of the first inverter IV11 is applied. The seventh transistor N16 has a gate and a drain, each of which is connected to a source of the sixth transistor N15. The eighth transistor N17 has a gate and a drain, each of which is connected to a source of the seventh transistor N16. The ninth transistor N18 has a gate to which the output signal of the first inverter IV11 is applied, a drain to be connected to a source of the eighth transistor N17, and a source to which the ground voltage 'VSS' is applied. At this time, the control division voltage 'V_ctdv' is output from a connection node between the seventh transistor N16 and the eighth transistor N17. The tenth transistor P12 has a gate to be connected to a node at which the first passing unit 'pass11' is connected to the third transistor N12, a source to which the external voltage 'VDD' is applied, and a drain to be connected to a drain of the sixth transistor N15. At this time, the control voltage 'V_ctrl' is output from a connection node between the sixth transistor N15 and the tenth transistor P12.

The discharging unit 224-2 lowers the control voltage 'V_ctrl' up to the voltage level of the ground voltage 'VSS' when the control signal 'ctrl' is enabled.

The discharging unit 224-2 includes an eleventh transistor N19. The eleventh transistor N19 has a gate to which the control signal 'ctrl' is applied, a drain to which the control voltage 'V_ctrl' is applied, and a source to which the ground voltage 'VSS' is applied.

Figure 3:
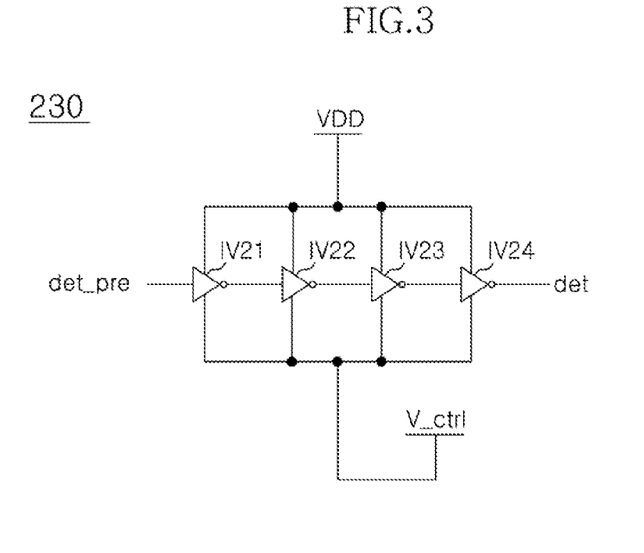
FIG. 3 is a circuit diagram illustrating a structure of an example of a driving unit of FIG. 1.

As shown in FIG. 3, the driving unit 230 can include second to fifth inverters IV21 to IV24 which are coupled in series to each other.

The driving unit 230 outputs the detection signal 'det' by driving the preliminary detection signal 'det_pre'. At this time, the external voltage 'VDD' and the control voltage 'V_ctrl', as driving voltages, are applied to each of the second to fifth inverters IV21 to IV24.

In the internal voltage level control unit 300, the lower the level of the detection signal 'det' is, the larger an increment range of the internal voltage 'V_int' is.

Figure 4:
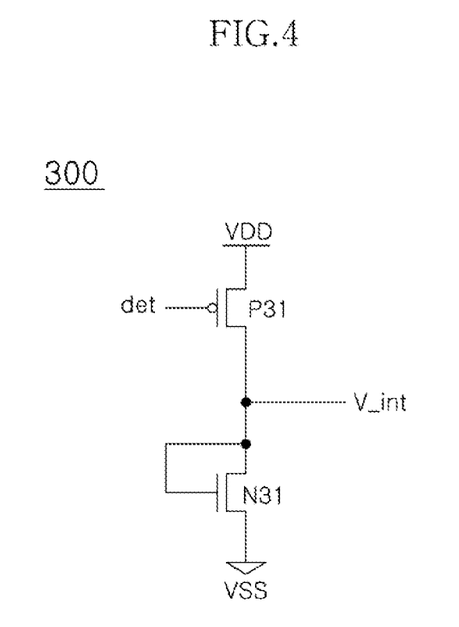
FIG. 4 is a circuit diagram illustrating a structure of an example of an internal voltage level control unit of FIG. 1.

As shown in FIG. 4, the internal voltage level control unit 300 can include a twelfth transistor P31 and a thirteenth transistor N31. The twelfth transistor P31 has a gate to which the detection signal 'det' is applied and a source to which the external voltage 'VDD' is applied. The thirteenth transistor N31 has a gate and a drain which are connected to a drain of the twelfth transistor P31 and a source to which the ground voltage 'VSS' is applied. At this time, the internal voltage 'V_int' is output from a connection node between the twelfth transistor P31 and the thirteenth transistor N31.

As mentioned above, the operation of the internal voltage generating circuit according to one embodiment will be described below.

The comparison unit 210 generates the preliminary detection signal 'det_pre' which is enabled when the internal voltage 'V_int' is lower than the target voltage (reference voltage level). At this time, the preliminary detection signal 'det_pre' is enabled in a low level.

When the voltage difference between the internal voltage 'V_int' and the target voltage is over a predetermined voltage, the control voltage generating unit 220 generates the control voltage 'V_ctrl' which is at a voltage level of the ground voltage 'VSS'. Meanwhile, when the voltage difference between the internal voltage 'V_int' and the target voltage is below the predetermined voltage, the control voltage generating unit 220 generates the control voltage 'V_ctrl' which is higher than the ground voltage 'VSS'.

The external voltage 'VDD' and the control voltage 'V_ctrl', as driving voltages, are applied to the driving unit 230. Accordingly, the driving unit 230 outputs the preliminary detection signal 'det_pre' as the detection signal 'det' which swings between two voltage levels of the external voltage 'VDD' and the control voltage 'V_ctrl'.

The lower the voltage level of the detection signal 'det' is, the more the internal voltage 'V_int' is increased by the internal voltage level control unit 300.

As a result, the internal voltage generating circuit of the semiconductor memory apparatus according to one embodiment generates the detection signal by comparing the internal voltage to the reference voltage and controls the voltage increment of the internal voltage by controlling the voltage level of the detection signal based on the voltage difference between the internal voltage and the reference voltage. Therefore, it is possible to prevent the internal voltage from being higher than the target voltage. Since the internal voltage is not higher than the target voltage, it has an effect on reduction of current consumption that is caused when the internal voltage is higher than the target voltage.

Figure 5:
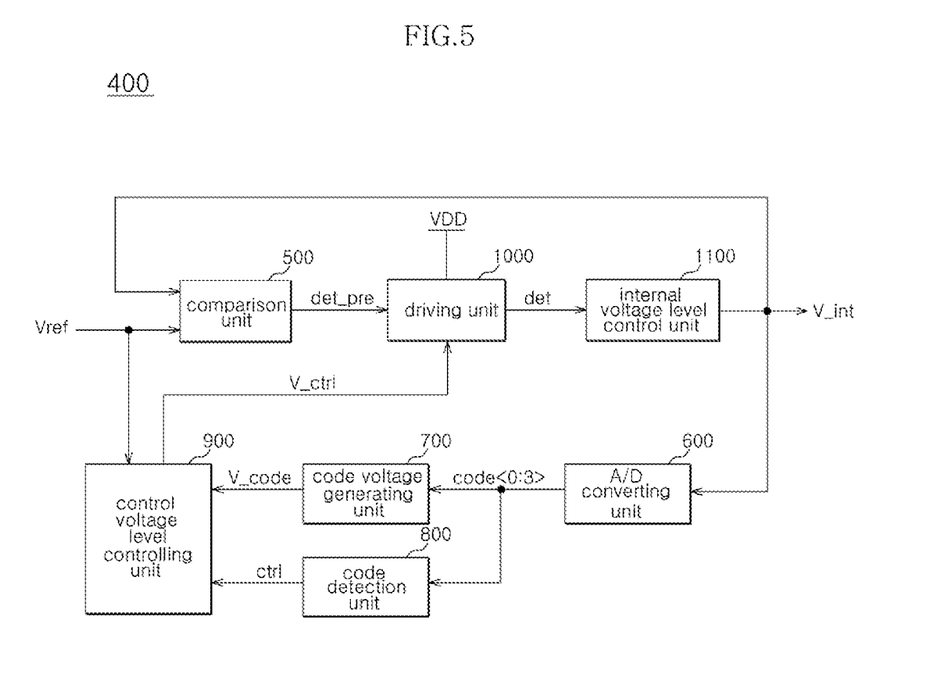
FIG. 5 is a schematic block diagram illustrating a structure of an example of an internal voltage generating circuit in a semiconductor memory apparatus according to another embodiment.

FIG. 5 is a schematic block diagram illustrating a structure of an example of an internal voltage generating circuit in a semiconductor memory apparatus according to another embodiment.

As shown in FIG. 5, the internal voltage generating circuit 400 of the semiconductor memory apparatus according to another embodiment includes a comparison unit 500, an A/D (analog/digital) converting unit 600, a code voltage generating unit 700, a code detection unit 800, a control-voltage-level controlling unit 900, a driving unit 1000, and an internal voltage level control unit 1100.

The comparison unit 500 generates a preliminary detection signal 'det_pre' by comparing an internal voltage 'V_int' with a reference voltage 'Vref'.

The A/D converting unit 600 generates a code 'code<0:3>' based on the internal voltage 'V_int'. For example, the A/D converting unit 600 determines the value of the code based on the internal voltage 'V_int'. The A/D converting unit 600 can be configured to change the code 'code<0:3>' into (0, 0, 0, 0), (0, 0, 0, 1), (0, 0, 1, 1), (0, 1, 1, 1), and (1, 1, 1, 1) when the internal voltage 'V_int' is increased (or decreased). At this time, the A/D converting unit 600 can be implemented by a general ADC (analog digital converter).

The code voltage generating unit 700 generates a code voltage 'V_code' which is correspondent to the value of the code 'code<0:3>'. A this time, the code 'code<0:3>' can include first to fourth code signals 'code<0>', 'code<1>', 'code<2>' and 'code<3>'.

The code voltage generating unit 700 is configured to make the code voltage 'V_code' a higher voltage level by increasing the number of transistors which are turned on by the value of the code 'code<0:3>'.

Figure 6:
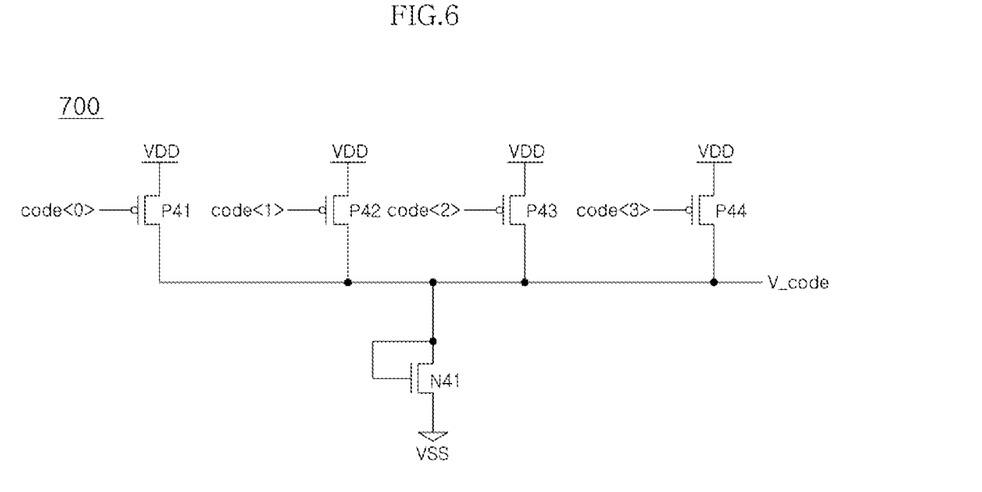
FIG. 6 is a circuit diagram illustrating a structure of an example of a code voltage generating unit of FIG. 5.

As shown in FIG. 6, the code voltage generating unit 700 can include first to fifth transistor P41 to P44 and N41. The first transistor P41 has a gate to which the first code signal 'code<0>' is applied and a source to which an external voltage 'VDD' is applied. The second transistor P42 has a gate to which the second code signal 'code<1>' is applied and a source to which the external voltage 'VDD' is applied. The third transistor P43 has a gate to which the third code signal 'code<2>' is applied and a source to which the external voltage 'VDD' is applied. The fourth transistor P44 has a gate to which the fourth code signal 'code<3>' is applied and a source to which the external voltage 'VDD' is applied. The fifth transistor N41 has a gate and a drain which are commonly connected to drains of the first to fourth transistors P41 to P44 and a source to which the ground voltage 'VSS' is applied. At this time, the code voltage 'V_code' is output from a node at which the drains of the first to fourth transistors P41 to P44 and the drain of the fifth transistor N41 are commonly connected to each other.

Figure 7:
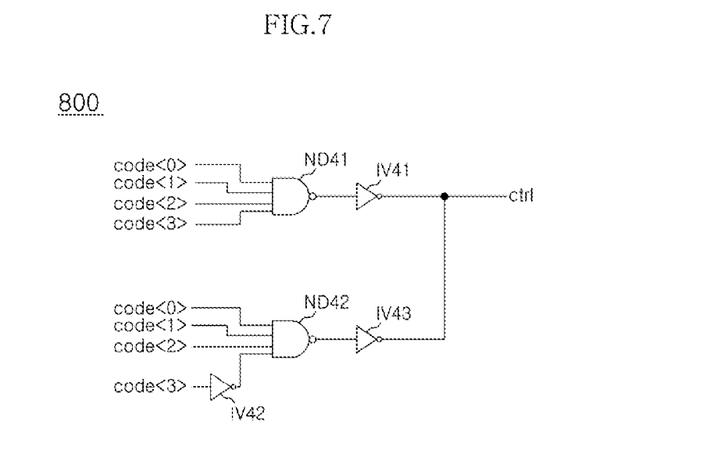
FIG. 7 is a circuit diagram illustrating a structure of an example of a code detection unit of FIG. 5.

The code detection unit 800 generates a control signal 'ctrl' which is enabled when the value of the code is below a predetermined code value. At this time, assuming that the values which are below the predetermined code value are (0, 1, 1, 1) and (1, 1, 1, 1), the code detection unit 800 can be implemented by a decoder as shown in FIG. 7.

The code detection unit 800 can include first and second NAND gates ND41 and ND42 and first to third inverters IV41, IV42 and IV43. The first NAND gate ND41 receives the first to fourth code signals 'code<0>' to 'code<3>'. The first inverter IV41 receives an output signal of the first NAND gate ND41. The second inverter IV42 receives the fourth code signal 'code<3>'. The second NAND gate ND42 receives the first to third code signals 'code<0>' to 'code<2>' and an output signal of the second inverter IV42. The third inverter IV43 receives an output signal of the second NAND gate ND42. At this time, the control signal 'ctrl' is output from a common node at which output terminals of the first and third inverters IV41 and IV43 are connected to each other.

The control-voltage-level controlling unit 900 generates a control voltage 'V_ctrl' at the ground voltage 'VSS' when the control signal 'ctrl' is enabled and generates the control voltage 'V_ctrl' to have a voltage level corresponding to the code voltage 'V_code' when the control signal 'ctrl' is disabled. At this time, the control-voltage-level controlling unit 900 may have the same configuration as the control-voltage-level controlling unit 224 in FIG. 2.

The driving unit 1000 drives the preliminary detection signal 'det_pre' and then outputs the detection signal 'det'. At this time, the external voltage 'VDD' and the control voltage 'V_ctrl', as driving voltages, are applied to the driving unit 1000. Furthermore, the driving unit 1000 can have the same configuration as the driving unit 230 of FIG. 3.

The lower the voltage level of the detection signal 'det' is, the larger the increment of the internal voltage 'V_int' is in the internal voltage level control unit 1100. At this time, the internal voltage level control unit 1100 can have the same configuration as the internal voltage level control unit 300 of FIG. 4.

The operation of the internal voltage generating circuit of the semiconductor memory apparatus according to another embodiment will be described below.

The comparison unit 500 generates the preliminary detection signal 'det_pre' by comparing the reference voltage 'Vref' with the internal voltage 'V_int'.

The A/D converting unit 600 generates the code 'code<0:3>' based on the internal voltage 'V_int'.

The code voltage generating unit 700 generates the code voltage 'V_code' according to the value of the code 'code<0:3>'.

The code detection unit 800 enables the control signal 'ctrl' when the value of the code 'code<0:3>' is (0, 1, 1, 1) or (1, 1, 1, 1).

The control-voltage-level controlling unit 900 generates the control voltage 'V_ctrl' at the voltage level of the ground voltage 'VSS' when the control signal 'ctrl' is enabled and generates the control voltage 'V_ctrl' which corresponds to the code voltage 'V_code' when the control signal 'ctrl' is disabled.

The external voltage 'VDD' and the control voltage 'V_ctrl', as the driving voltages, are applied to the driving unit 230. Accordingly, the driving unit 230 outputs the preliminary detection signal 'det_pre' as the detection signal 'det' which swings between the voltage levels of the external voltage 'VDD' and the control voltage 'V_ctrl'.

The lower the voltage level of the detection signal 'det' is, the larger the increment of the internal voltage 'V_int' is in the internal voltage level control unit 300.

As a result, the internal voltage generating circuit of the semiconductor memory apparatus according to one embodiment generates the detection signal by comparing the internal voltage with the reference voltage and controls the voltage increment of the internal voltage by controlling the voltage level of the detection signal based on the voltage difference between the internal voltage and the reference voltage. Therefore, it is possible to prevent the internal voltage from being higher than the target voltage. Since the internal voltage is not higher than the target voltage, a large amount of current consumption, that is caused when the internal voltage is higher than the target voltage, can be prevented.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. An internal voltage generating circuit of a semiconductor memory apparatus comprising:
a comparison unit configured to generate a preliminary detection signal by comparing an internal voltage with a reference voltage;
an A/D converting unit configured to generate a code based on the internal voltage;
a code voltage generating unit configured to output a code voltage corresponding to the code;
a code detection unit configured to generate a control signal which is enabled when a value of the code is lower than a predetermined code value;
a control-voltage-level controlling unit configured to output a control voltage which is at a ground voltage level when the control signal is enabled and to output the control voltage corresponding to the code voltage when the control signal is disabled;
a driving unit configured to output a detection signal by receiving an external voltage and the control voltage as driving voltages and then driving the preliminary detection signal; and
an internal voltage level control unit configured to increase the internal voltage as a voltage level of the detection signal is lowered.

2. The internal voltage generating circuit of claim 1, wherein the control-voltage-level controlling unit comprises:
a voltage maintaining unit configured to compare a divided voltage of the reference voltage with the code voltage and then maintain the control voltage which is higher than the ground voltage level when the control signal is disabled; and
a discharging unit configured to lower the control voltage to the ground voltage level when the control signal is enabled.

3. The internal voltage generating circuit of claim 2, wherein the code detection unit includes a decoder corresponding to each of the code values of the predetermined code.

4. The internal voltage generating circuit of claim 2, wherein the code voltage generating unit is configured to increase the code voltage by increasing a number of transistors which are turned on based on the code value.

* * * * *